United States Patent [19]

Kaminow et al.

[11] Patent Number: 5,396,507
[45] Date of Patent: Mar. 7, 1995

[54] REFLECTIVE DIGITALLY TUNABLE LASER

[75] Inventors: Ivan P. Kaminow, Holmdel; Martin Zirngibl, Middletown, both of N.J.

[73] Assignee: AT&T Corp., Murray Hill, N.J.

[21] Appl. No.: 152,603

[22] Filed: Nov. 15, 1993

[51] Int. Cl.$^6$ ............................................. H01S 3/10
[52] U.S. Cl. ........................................ 372/20; 372/6; 372/92; 372/97; 372/64; 372/108; 372/99; 372/23; 385/46
[58] Field of Search ................... 372/6, 20, 23, 64, 97, 372/92, 108; 385/46

[56] References Cited

U.S. PATENT DOCUMENTS

| | | | |
|---|---|---|---|
| 5,002,350 | 3/1991 | Dragone | 350/96.15 |
| 5,136,671 | 8/1992 | Dragone | 385/46 |

OTHER PUBLICATIONS

Woodward et al., "Effects of Aging on the Bragg Section of DBR Laser," IEEE Photon. Tech. Lett., 5(7), (Jul. 1993) at 750–52.
Soole et al., "Multistripe Array Grating Integrated Cavity (MAGIC) Laser: A New Semiconductor Laser for WDM Applications," Elect. Lett., 28(19), (Sep. 1992) at 1805–7.
Soole et al., "Wavelength-selectable Laser Emission from a Multistripe Array Grating Integrated Cavity Laser," Appl. Phys. Lett., 61(22), (Dec. 1992) at 2750–52.
Poguntke et al., "Simultaneous Multiple Wavelength Operation of a Multistripe Array Grating Integrated Cavity Laser," Appl. Phys. Lett., 62(17), (Apr. 1993) at 2024–26.
C. Dragone, "An NxN Optical Multiplexer Using a Planar Arrangement of Two Star Couplers," IEEE Photon. Tech. Lett., 3(9), (Sep. 1991) at 812–15.
Glance et al., "Applications of the Integrated Wavelength Router," submitted Sep. 1993 for publication in the Journal of Lightwave Technology.
Zirngibl et al., "Demonstration of a 15×15 Arrayed Waveguide Multiplexer on InP," IEE Photon. Tech. Lett., 4(11), (Nov. 1992) at 1250–53.
Zirngibl et al., "Polarisation Independent 8×8 Waveguide Grating Multiplexer on InP," Elect. Lett., 29(2), (Jan. 1993) at 201–02.

*Primary Examiner*—Léon Scott, Jr.

[57] ABSTRACT

A tunable laser formed on a semiconductive wafer comprising a plurality of monolithically integrated optical amplifiers and a planar optical multiplexer is disclosed. According to the invention, one of the optical amplifiers is activated by energy, which amplifier produces a signal. The signal is carried along a waveguide associated with the optical amplifier and enters a reflective Dragone router, which is the preferred optical multiplexer. The reflective Dragone router functions, in conjunction with the activated optical amplifier, to define a wavelength selective optically transmissive pathway to create lasing action. Facet mirrors are cleaved in the semiconductive wafer defining the lasing cavity which includes the optical amplifiers, associated waveguides and the reflective Dragone router.

34 Claims, 3 Drawing Sheets

REFLECTIVE DIGITALLY TUNABLE LASER

CROSS-REFERENCE TO RELATED APPLICATIONS

This application is related to application Ser. No. 08/019,961 [Glance-Wilson 22–2] of Bernard Glance and Robert Wilson, entitled "Rapidly Tunable Integrated Optical Filter."

This application is related to application Ser. No. 08/019,957 [Glance-Wilson 23–3] of Bernard Glance and Robert Wilson, entitled "Rapidly Tunable Wideband Integrated Optical Filter."

This application is related to application Ser. No. 08/019,951 [Glance-Wilson 24–4] of Bernard Glance and Robert Wilson, entitled "Rapidly Tunable Wideband Integrated Laser."

This application is related to application Ser. No. 08/019,952 [Dragone-Kaminow 34–41] of Corrado Dragone and Ivan Kaminow, entitled "Rapidly Tunable Integrated Laser."

This application is related to application Ser. No. 08/138,659 [Glance Wilson 27–7] of Bernard Glance and Robert Wilson, entitled "Optical Passband Filter."

This application is related to application Ser. No. 08/135,836 [Zirngibl 4] of Martin Zirngibl, entitled "High Power, Single-Frequency Tunable Laser," filed on Oct. 13, 1993. These related applications, as well as all other papers or patents referred to herein are incorporated by reference in their entirety.

FIELD OF THE INVENTION

This invention relates generally to optical communication systems, and more particularly to tunable lasers for use in optical communication systems.

BACKGROUND OF THE INVENTION

Information transfer over an optical fiber transmission system can be increased by optical wavelength division multiplexing (WDM). In WDM systems, a number of different wavelength optical signals, known as "channels," are transmitted in parallel along a single fiber. Multiplexing requires that there be a way of conveniently producing optical energy at different wavelengths corresponding to the channels of a WDM system. To produce a cost effective WDM system, components must be fabricated to provide reproducible and exact channel spacing.

An ideal source of such optical energy is a laser. A laser which is potentially suitable for WDM applications is the tunable semiconductor laser. Such a laser is tuned by injecting current into part of the laser cavity, which injection changes the refractive index of the waveguide. However, the tuning range is limited and exact tuning versus current characteristics are difficult to predict and are subject to aging. Woodward et al., "Effects of Aging on the Bragg Section of DBR Laser," IEEE Photon. Tech. Lett., 5(7) at 750–52 (1993).

Another approach for producing a suitable WDM energy source is to monolithically integrate optical amplifiers with a planar optical multiplexer on a semiconductive wafer. The optical cavity, which includes a multiplexer and a gain section, is defined by two cleaved facets. When one of the amplifiers is turned on, it will receive optical feedback that has been filtered by the multiplexer. Above the lasing threshold, lasing will occur at the cavity resonant wavelength nearest peak filter transmission. This wavelength will shift by exactly one multiplexer channel spacing if the neighboring amplifier is pumped instead. The device can be digitally tuned to the desired wavelength channel by driving the appropriate gain section. Tuning is now no longer limited by the obtainable change in refractive index, but only by the gain bandwidth of the amplifier. Furthermore, channel spacings are very accurate because each individual amplifier "sees" the same diffractive element.

The multiple array grating integrated cavity (MAGIC) laser is an example of the above described laser. See Soole et al., "Multistripe Array Grating Integrated Cavity (MAGIC) Laser: A New Semiconductor Laser for WDM Applications," Elect. Lett., 28(19) at 1805–07 (1992); Soole et al., "Wavelength-selectable Laser Emission from a Multistripe Array Grating Integrated Cavity Laser," Appl. Phys. Lett., 61(23) at 2750–52 (1992); Poguntke et al., "Simultaneous Multiple Wavelength Operation of a Multistripe Array Grating Integrated Cavity Laser," Appl. Phys. Lett., 62(17) at 2024–26 (1993). As described in these papers, this device uses a curved mirror grating as the wavelength selective element. This laser is said to achieve exact channel spacings and tuning ranges. However, the device only operates under pulsed current injection and has a relatively small background spontaneous emission suppression of 20–25 dB. These limitations may be due to the high loss of the curved mirror grating. Losses may occur because of the difficulty in producing a smoothly curved mirror. Losses tend to increase with increasing roughness of the mirror.

Thus the performance of these lasers for WDM applications has been limited in terms of threshold current, tuning speed, frequency selectivity or tuning range.

It is known to use a Dragone router or waveguide as a wavelength selective intracavity filter in place of the curved mirror grating. See related application Ser. No. 08/019,952; Dragone, "An N×N Optical Multiplexer Using a Planar Arrangement of Two Star Couplers," IEEE Photon. Tech. Lett., 3(9) at 812–15 (1991) and Glance, et al., "Applications of the Integrated Wavelength Router," submitted for publication in the Journal of Lightwave Technology. The Dragone router utilized in Ser. No. 08/019,952 may be described as a transmissive Dragone router. The transmissive Dragone router includes two free space regions connected by an optical grating comprised of unequal length waveguides. Each free space region is also connected to another plurality of waveguides, which waveguides are not part of the transmissive Dragone router. Each of these other plurality of waveguides contain optical amplifiers. The optical amplifiers connect these other waveguides, located at each end of the transmissive Dragone router, to a cleaved facet formed in the semiconductive wafer on which the aforementioned elements are formed. The two cleaved facets comprise reflective mirrors defining a cavity in which lasing action can be supported. Different laser wavelengths can be selected by exciting one amplifier from each of the plurality of waveguides.

SUMMARY OF THE INVENTION

In accordance with this invention, a rapidly tunable laser has been developed which provides a well-defined set of operating wavelengths.

The invention comprises a plurality of monolithically integrated optical amplifiers, a planar optical multiplexer and a device for activating one of the optical amplifiers. Preferably, a reflective Dragone router is used as the multiplexer. The reflective Dragone router has only one free space region having at one side a grating having waveguides of path lengths that are approximately one half the lengths of the waveguides of the grating of the transmissive Dragone router and at the other side a plurality of waveguides. The reflective Dragone router thus differs from the transmissive Dragone router described in application Ser. No. 08/019,952. A tunable laser utilizing a reflective Dragone router according to the present invention requires substantially less structure than a tunable laser utilizing a transmissive Dragone router.

In one embodiment of the invention, the reflective Dragone router is formed by cleaving a transmissive Dragone router in half to form two reflective Dragone routers.

In another embodiment of the invention, a reflective Dragone router is formed on a semiconductor wafer between two reflective surfaces. The other waveguides associated with the reflective Dragone router each contain an integrated optical amplifier selectively being activated to provide gain to the optical energy flowing through a respective waveguide, or not activated to act as a gate preventing the flow of energy through a respective waveguide. A specific optical amplifier may be activated by a bias current so that lasing action occurs in a predetermined path between the reflective surfaces. This path is such that lasing action is supported at a particular selected wavelength. The operating wavelength of a laser according to the present invention is therefore selected in a discrete, digital manner by biasing a specific optical amplifier. The laser is rapidly tunable to any of a number, N, wavelengths, corresponding to the number of waveguides and optical amplifiers associated with the wavelength selective device by rapidly biasing different optical amplifiers to an active state. Digital access to wavelength channels that are precisely spaced is achieved.

In a further embodiment of the invention, a tunable laser is formed according to Ser. No. 08/019,952 utilizing the transmissive Dragone router, and then cleaved to form two reflective tunable lasers as described above.

In an additional embodiment, a non-tunable laser which operates at a single, discrete wavelength may be formed by using one optical amplifier and one associated waveguide in conjunction with a reflective Dragone router.

DETAILED DESCRIPTION OF THE INVENTION

Figure 1:
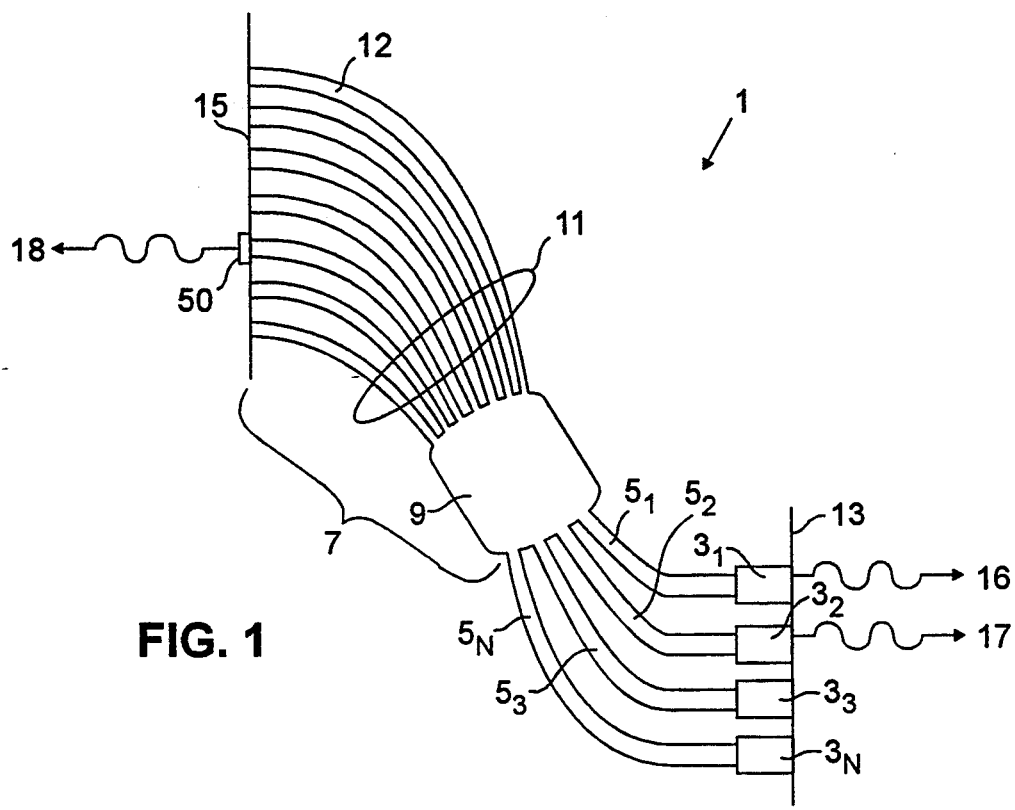
FIG. 1 is a schematic diagram of a digital laser according to the present invention.

A digital laser 1 according to the present invention is illustrated in FIG. 1. The laser 1 comprises a number of optically active sections $3_{1-N}$, also referred to as optical amplifiers, for providing optical amplification, a number of waveguides $5_{1-N}$ for carrying optical signals, and a wavelength selective device 7 for providing wavelength selectivity.

Each optical amplifier 3 comprises a doped section of waveguide with controllable optical transmissivity. The sections defining the optical amplifiers $3_{1-N}$ are optically active in that application of electrical energy will cause them to become transmissive to the flow of optical energy and further provide some amount of gain to optical signals flowing through them. In the absence of applied electrical energy, these doped sections of waveguide are substantially opaque to the transmission of light. The specially doped sections thus may be considered to be optical amplifiers or gates depending upon whether or not they are activated, i.e., excited with electrical energy such as a bias current. The doped sections may be formed using standard techniques well known to those skilled in the art, including, but not limited to, metalorganic vapor phase epitaxy. A gate control device 4, shown in FIG. 2, selectively provides bias current to one of the optical amplifiers $3_{1-N}$. The design of a gate control device is well known to those skilled in the art.

The reflective wavelength selective device 7 illustrated in FIG. 1 may be defined on a wafer. The device 7 comprises a free space region 9 for expansion of the signal from one of the waveguides $5_{1-N}$, and a waveguide grating 11 comprised of waveguides or grating arms 12. The number, N, of waveguides $5_{1-N}$ does not necessarily correspond to the number of grating arms 12 in the grating 11. Typically, there are more grating arms in the grating 11 than waveguides $5_{1-N}$, so that the number, M, of grating arms 12 is greater than N, or M>N. The ratio of M to N is usually about 3, but this value is not preferred over others.

The digital laser 1 further includes two cleaved facets or surfaces 13 and 15 which comprise high reflection mirrors defining a cavity in which lasing action can be supported.

The waveguides $5_{1-N}$ containing optical amplifiers $3_{1-N}$, the wavelength selective device 7 and the cleaved surfaces 13, 15 may be monolithically integrated on a semiconductor wafer using techniques known to those skilled in the art.

The plurality of optical amplifiers $3_{1-N}$ connect one end of the waveguides $5_{1-N}$ to the first cleaved surface 13. There is a preferably a one to one correspondence between the number of waveguides $5_{1-N}$ and the number of optical amplifiers $3_{1-N}$. The waveguides $5_{1-N}$ are connected, at their other end, to the free space region 9. The free space region 9 is also connected to the plurality of grating arms 12 which form grating 11. As mentioned above, the grating 11 and the free space region 9 comprise the wavelength selective device 7. The grating 11 terminates at the second cleaved surface 15. For a non-tunable laser, only one optical amplifier 3 and one waveguide 5 is used in conjunction with the wavelength selective device 7.

Figure 2:
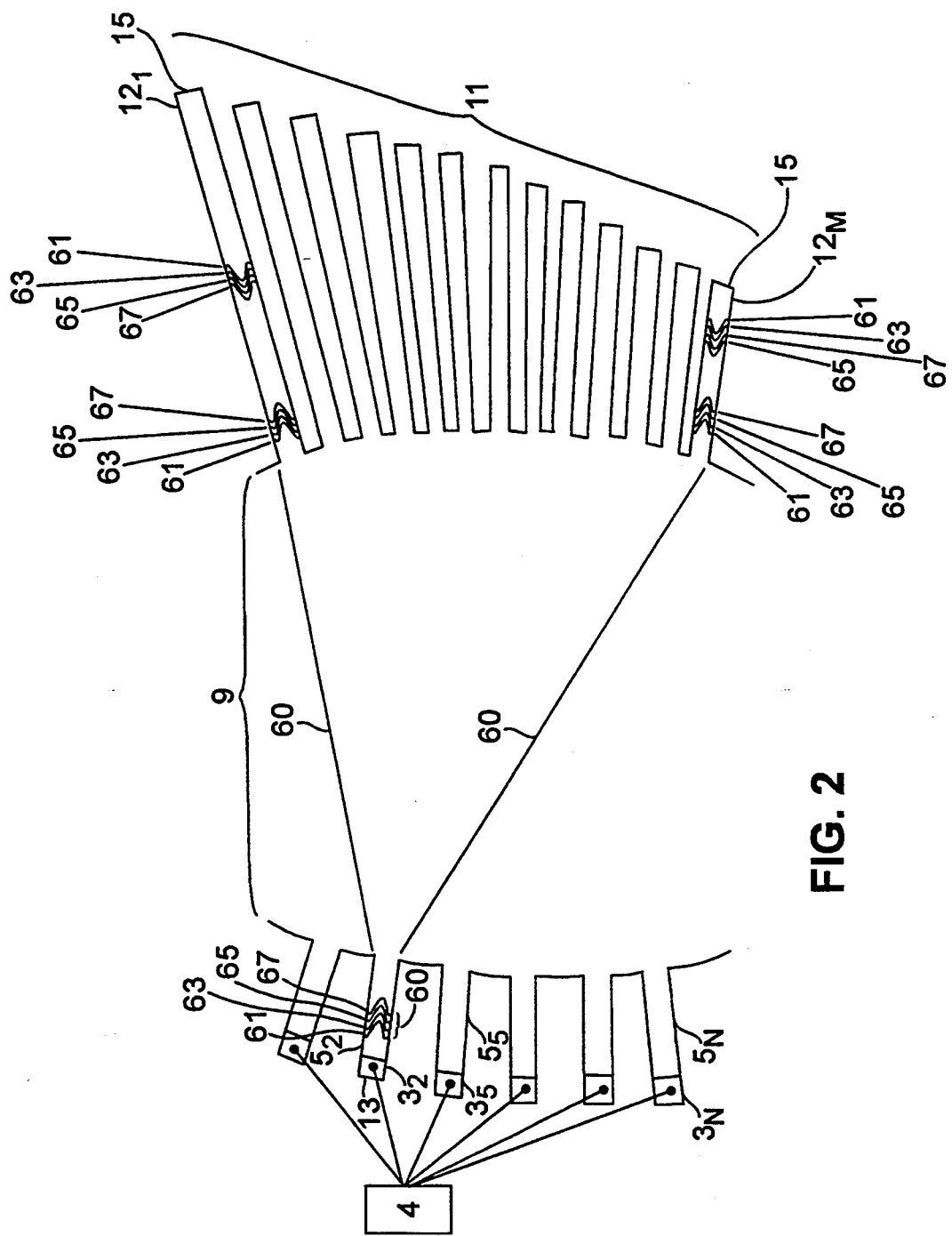
FIG. 2 illustrates the operating principle of the reflective Dragone router.

The overall operation of a tunable laser 1 may be summarized as follows. Selectively applying electrical energy, such as a bias current, through the gate control device 4, to one of the optical amplifiers $3_{1-N}$ will create certain wavelength selective optical pathways between the cleaved facets 13 and 15 due to the behavior of the wavelength selective device 7. Optical energy, spontaneously emitted from one of the amplifiers $3_{1-N}$, travels along the waveguide associated with the emitting amplifier. As illustrated in FIG. 2, the emitted optical energy or signal 60 emitted from an optical amplifier 32, for example, when excited by a bias current, is comprised of a plurality of spectral components 61, 63, 65, 67 of differing wavelengths $\lambda_1$, $\lambda_2$, $\lambda_3$, $\lambda_n$. It should be understood that the signal will have more than four spectral components, so that component "67" is intended to represent the "Nth" component. The signal 60 expands in the free space region 9 so that the signal 60 enters each of the grating arms $12_{1-M}$. The signal 60 travels along the grating arms until it reaches the facet mirror 15. Upon contact with the mirror 15, the light is reflected back along the grating arms and reenters the free space region 9. The grating arms $12_{1-M}$ introduce a phase delay between the spectral components 61, 63, 65, 67 causing the components to couple to different waveguides $5_{1-N}$. For example, spectral component 65, having a wavelength $\lambda_3$, might couple to the waveguide $5_3$. After coupling to the appropriate waveguides $5_{1-N}$, the individual spectral components propagate to the optical amplifiers $3_{1-N}$. Since only one amplifier is biased, amplifier $3_2$ in FIG. 2, the remaining amplifiers absorb any light reaching them. So, if spectral component 65 coupled to waveguide $5_3$, it would be absorbed in the optical amplifier $3_3$ since only amplifier $3_2$ is biased in the present example.

Thus, by biasing only one of the amplifiers $3_{1-N}$, a specific transparent route between the mirrors 13, 15 for lasing action is defined, which route supports propagation of light of a specific wavelength. Stationary waves can be sustained only for wavelengths within a passband associated with this route. Wavelengths outside of this passband are suppressed by the lossy unbiased optical amplifiers. Lasing occurs at the Fabry-Perot mode whose wavelength is nearest the passband maximum. Adjacent Fabry-Perot modes are suppressed by passband selectivity which can be adjusted by appropriate circuit design. There are N passbands $\Delta\lambda$ wide repeated periodically with a free spectral range (FSR) period $N\Delta\lambda$. Assuming that the gain of the active semiconductor medium peaks sufficiently over one of these FSRs, N lasing wavelengths can be obtained in this FSR by activation of selected optical amplifiers $3_{1-N}$. Wavelengths outside this FSR are suppressed by gain discrimination. Tuning can thus be achieved at discrete wavelengths separated by intervals $\Delta\lambda$ over a tuning range $N\Delta\lambda$.

The details of construction and operation of transmissive wavelength selective devices are more fully described in Dragone et al., supra; Zirngibl et al., "Demonstration of a 15×15 Arrayed Waveguide Multiplexer on InP," IEEE Photon. Tech. Lett., 4(11) at 1250-53 (1992); Zirngibl et al., "Polarisation Independent 8×8 Wavegide Grating Multiplexer on InP," Elect. Lett., 29(2) at 201-02 (1993) and U.S. Pat. Nos. 5,002,350 and 5,136,671. The reflective wavelength selective device may be formed by cleaving such transmissive wavelength selective devices into two pieces, preferably of equal size. A laser according to the present invention may be formed by cleaving the laser described in Ser. No. 08/019,952 in half.

Described below is an example illustrating how the laser of FIG. 1 may be tuned to a plurality of discrete optical wavelengths. If it is desired that the laser of FIG. 1 produce optical energy at a wavelength $\lambda_1$, bias current is applied to optical amplifier $3_1$. The bias current applied to the optical amplifier $3_1$ is above the lasing threshold for the semiconductor material. An optically transmissive path is thereby defined between the reflective surfaces 13 and 15 comprising the optical amplifier $3_1$, the waveguide $5_1$, and the wavelength selective device 7. An optical standing wave is created between the mirrors 13 and 15 at the wavelength $\lambda_1$, and laser light at that wavelength may be emitted by the device from mirror 13 at reference numeral 16. In such a case, the mirror 13 may be partially transmissive, for example, 80 percent reflective, while face 15 may be substantially totally reflective, for example, 98 percent reflective. A coating (not shown) may be added to the facet mirror 13 so that it will be more reflective than a non-coated facet mirror, yet still be partially transmissive. A high reflection coating (not shown) may be applied to facet mirror 15 so that it will be highly reflective. Such coatings are well known to those skilled in the art.

Similarly, if it is desired that the laser 1 of FIG. 1 produce optical energy at a wavelength $\lambda_2$, bias current is applied to the optical amplifier $3_2$. Again, the bias current applied to the optical amplifier is above the lasing threshold for the semiconductor material. An optically transmissive path is thereby defined between the faces 13 and 15 comprising the optical amplifier $3_2$, the waveguide $5_2$ and the wavelength selective device 7. An optical standing wave is created between the faces 13 and 15 at the wavelength $\lambda_2$ and laser light at that wavelength is emitted by the device of FIG. 1 at reference numeral 17. Optical energy at wavelengths $\lambda_3$ to $\lambda_N$ may be produced by activating optical amplifiers $3_3$ to $3_N$, respectively, instead of activating the optical amplifiers $3_1$ or $3_2$. The operating wavelength of the laser of FIG. 1 may rapidly be changed by biasing a different optical amplifier.

In a preferred embodiment, the mirrors 13, 15 may be appropriately coated so that the mirror 13 is substantially totally reflective and mirror 15 is partially transmissive, so that light is emitted by the device at mirror 15. In a most preferred embodiment, a single output port 18 is provided for light of any wavelength at mirror 15. In this case, mirrors 13 and 15 are highly reflective except at the output port 18 which is associated with one of the grating arms 12. At the output port 18, the mirror 15 is coated with an anti-reflection material 50 so that it is substantially transmissive. There is presently no preference as to which grating arm is selected for location of the output port 18.

Figure 3:
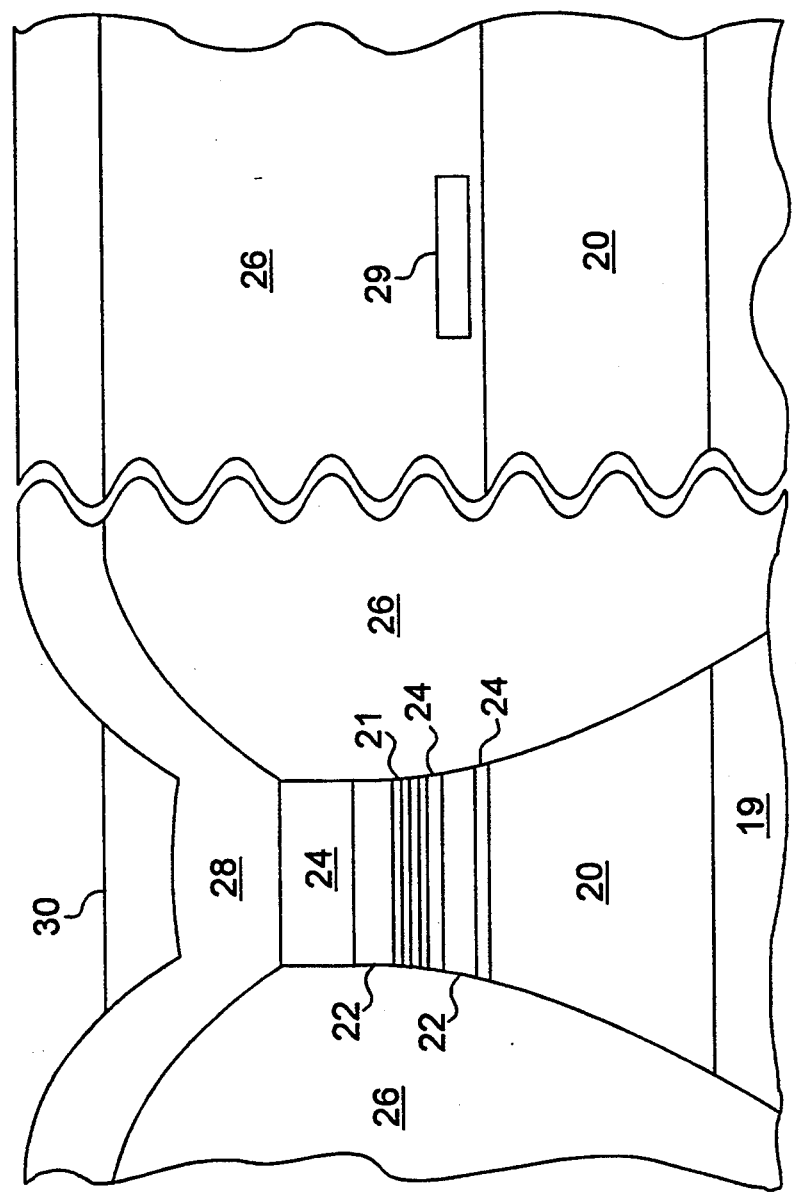
FIG. 3 is a cross section through a digital laser according to the present invention.

A laser according to the present invention has been produced and tested. A reflective 1×7 Dragone router, formed by cleaving a transmissive 1×7 Dragone router, was used as the wavelength selective device 7, which demultiplexes seven equally spaced wavelength channels. The path length difference between adjacent grating arms is 61.46 micrometers. A cross section through the laser is shown in FIG. 3. The left side of FIG. 3 illustrates the semiconductor structure of a section of the active waveguide $5_{1-N}$ doped to create an optical amplifier suitable for use in the present invention. The right side of FIG. 3 illustrates an undoped section of passive waveguide.

The epitaxial growth and regrowth for the device were accomplished by low pressure (100 torr) metalorganic vapor phase epitaxy. Indium phosphide (InP) was used as the substrate 19. Any substrate suitable for laser fabrication may be used, including, but not limited to, InP or gallium arsenide (GaAs). The substrate was S-doped ($2\times10^{18}/cm^{-3}$). The rib waveguide structure 20 was formed from InGaAsP. The waveguide region 20 provides waveguiding in the vertical direction while region 29 provides lateral waveguiding. The amounts of the Group III organometallics and the arsine were varied to form a continuously graded region to cover a 1.1 to 1.35 micrometer band gap. To produce the active region of the laser cavity (the optical amplifier), 1.58 micrometer InGaAsP quantum wells 21 and 1.35 micrometer band gap InGaAsP barriers 22 lattice matched to the InP substrate 24 were used. Diethyl zinc and disilane were the sources for the p- and n-type dopants. Passive waveguides and amplifier sections were defined by wet-chemical etching after the first growth. Then, a semi-insulating InP layer 26 was grown everywhere except on the amplifiers. The final regrowth, a heavily doped p+-InP layer 28 with a p+-InGaAsP cap, not shown, serves as a contact layer.. Contacts 30 were then metallized and the facets, not shown, were cleaved and high reflection mirrors were deposited thereon.

Figure 4:
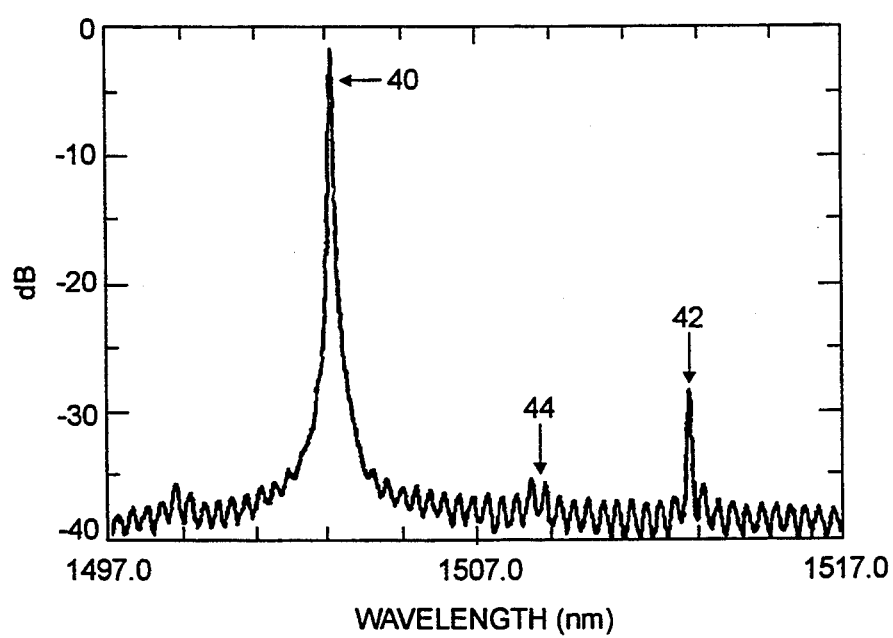
FIG. 4 illustrates the spectral results observed at a port of a digital laser according to the present invention.

The device was tested by sequentially turning on all the amplifiers. A fiber microlens was coupled to each amplifier port and light was directed to a optical spectrum analyzer. FIG. 4 shows the results of the spectral analysis of light from the fourth port. The continuous wave (CW) threshold current was 101.5 milliAmps (mA). The laser emitted −1.8 dBm power for a pump current of 120 mA. The emission wavelength 40 of the laser was 1502.52 nm. The next sets of modes 42, which are one FSR away, are suppressed by more than 30 db. The background spontaneous emission, which peaks at reference number 44, is down by more than 35 dB. For different bias conditions, the laser emitted on the neighboring modes at 1492.95 nm or 1512.78 nm. Thus, the FSR of the multiplexer was 9.9 nm and the channel spacing was 2.82 nm. The emission wavelength of the other ports were consistent with this channel spacing and FSR.

To suppress spurious modes from the laser, a wavelength selective mirror can be employed and the optical amplifiers should be designed with a peaked gain profile.

It should be understood that the embodiments and variations shown and described herein are illustrative of the principles of this invention and that various modifications may occur to, and be implemented by those skilled in the art without departing from the scope and spirit of the invention.

We claim:

1. A tunable laser, comprising:
   a first reflective surface formed in a semiconductive wafer;
   a second reflective surface formed in the semiconductive wafer at a position spaced from the first reflective surface;
   a first plurality of waveguides formed in the semiconductive wafer connecting the first reflective surface to a free space region;
   a wavelength selective device formed in the semiconductive wafer, wherein the wavelength selective device comprises the free space region and a second plurality of waveguides, each waveguide having a different length, the second plurality of waveguides collectively defining an optical grating, where the optical grating is connected, at one end, to the second reflective surface and at the other end to the free space region;
   at least two controllable optical amplifiers formed in at least two of the waveguides of the first plurality of waveguides, each optical amplifier having an active state for providing optical gain and a gate state wherein the optical amplifiers are not optically transmissive to the first reflective source; and
   a means for selectively providing bias current to one of the optical amplifiers to place the one optical amplifier in the active state,
   where the active optical amplifier, the waveguide in which it is formed and the wavelength selective device define a wavelength selective optically transmissive pathway to generate lasing action and where the lasing wavelength is determined by the one optical amplifier which is in the active state.

2. The laser of claim 1 where the wavelength selective device is a reflective Dragone router.

3. The laser of claim 1 where the wavelength selective device has a free spectral range greater than or equal to the product of the number of discrete laser wavelengths and the desired channel spacing.

4. The laser of claim 1 where the light is emitted from the laser at the first reflective surface.

5. The laser of claim 1 where the light is emitted from the laser at the second reflective surface.

6. The laser of claim 1 where light is emitted from the laser at the second reflective surface at a single location from one of the waveguides of the second plurality of waveguides.

7. The laser of claim 1 where at least one of the reflective surfaces further comprises a wavelength selective mirror.

8. The laser of claim 1 where the optical amplifiers have a peaked gain profile.

9. A laser selectively tunable to one of a first plurality of wavelengths comprising:
   a semiconductor wafer having a first reflective surface and a second reflective surface;
   a free space region in the semiconductor wafer;
   a first plurality of waveguides in the semiconductor having a first end terminating in the free space region and a second end terminating in the first reflective surface;
   a plurality of optical amplifiers respectively located in the second end of the first plurality of waveguides, each optical amplifier having an active state for providing optical gain and a gate state that is optically opaque wherein the optical amplifiers are not optically transmissive to the first deflective surface;
   a second plurality of waveguides in the semiconductor wafer having a first end terminating in the free space region and a second end that terminates in the second reflective surface and, the second plurality of waveguides each having a different length and said second plurality of waveguides collectively defining an optical grating;
   means for placing one of said optical amplifers in an active state to generate lasing action at a wavelength determined by the one active optical amplifier.

10. A non-tunable laser, comprising:
   a first reflective surface formed in a semiconductive wafer;
   a second reflective surface formed in the semiconductive wafer at a position spaced from the first reflective surface;
   a first waveguide formed in the semiconductive wafer connecting the first reflective surface to a free space region;
   a wavelength selective device formed in the semiconductive wafer, wherein the wavelength selective device comprises the free space region and a plurality of waveguides, each waveguide having a different length, the plurality of waveguides collectively defining an optical grating, where the optical grating is connected, at one end, to the second reflective surface and at the other end to the free space region;

a controllable optical amplifier formed in the first waveguide, the optical amplifier having an active state for providing optical gain and a gate state wherein the optical amplifier is not optically transmissive to the first reflective surface; and a means for providing energy to the optical amplifier to place the optical amplifier in the active state, where the active optical amplifier, the waveguide in which it is formed and the wavelength selective device define a wavelength selective optically transmissive pathway to generate lasing action.

11. The laser of claim 10 where the wavelength selective device is a reflective Dragone router.

12. The laser of claim 10 where the light is emitted from the laser at the first reflective surface.

13. The laser of claim 10 where the light is emitted from the laser at the second reflective surface.

14. The laser of claim 10 where light is emitted from the laser at the second reflective surface at a single location from one of the waveguides of the plurality of waveguides.

15. The laser of claim 10 where at least one of the reflective surfaces further comprises a wavelength selective mirror.

16. The laser of claim 10 where the optical amplifier has a peaked gain profile.

17. A method for generating laser light comprising:
providing a first reflective surface in a semiconductive wafer;
providing a second reflective surface in the semiconductive wafer at a position spaced from the first reflective surface;
providing a first plurality of waveguides in the semiconductive wafer, which waveguides connect the first reflective surface to a free space region;
providing a wavelength selective device in the semiconductive wafer, wherein the wavelength selective device comprises the free space region and a second plurality of waveguides, each waveguide having a different length, the second plurality of waveguides collectively defining an optical grating, where the optical grating is connected, at one end, to the second reflective surface and at the other end to the free space region;
providing at least two controllable optical amplifiers formed in at least two of the waveguides of the first plurality of waveguides, each optical amplifier having an active state for providing optical gain and a gate state wherein the optical amplifier is not optically transmissive to the first reflective surface;
selectively providing energy to one of the optical amplifiers to place the one optical amplifier in the active state;
defining a wavelength selective optically transmissive pathway including the active optical amplifier, the waveguide in which the active optical amplifier is formed and the wavelength selective device; and
generating lasing action in the defined pathway at a lasing wavelength determined by the one optical amplifier which is in the active state.

18. The method of claim 17 where providing the wavelength selective device further comprises providing a reflective Dragone router.

19. The method of claim 17 further comprising emitting laser light at the first reflective surface.

20. The method of claim 17 further comprising emitting laser light at the second reflective surface.

21. The method of claim 17 further comprising emitting laser light at the second reflective surface at a single location from one of the waveguides of the second plurality of waveguides.

22. The method of claim 17 where providing a first and second reflective surface further comprises providing at least one reflective surfaces that is a wavelength selective mirror.

23. The method of claim 17 where providing at least two controllable optical amplifiers further comprises providing at least two controllable optical amplifiers with a peaked gain profile.

24. A method for forming a tunable laser comprising:
forming a wavelength selective device in a semiconductive wafer, wherein the wavelength selective device includes a free space region and a plurality of waveguides, each waveguide having a different length, the plurality of waveguides collectively defining an optical grating, and the optical grating is connected at one end to the free space region;
forming a plurality of input waveguides in the semiconductive wafer which connect to the free space region;
forming at least two controllable optical amplifiers in at least two of the waveguides of the plurality of input waveguides by appropriately doping the waveguides in a suitable manner with semiconductors;
forming a device for selectively providing energy to the optical amplifiers; and
cleaving the semiconductive wafer at two spaced locations to form a first and second facet mirror, where the first facet mirror is connected to the wavelength selective device by the input waveguides containing the optical amplifiers and the second facet mirror is connected to the plurality of waveguides defining the optical grating.

25. The method of claim 24 where forming the wavelength selective device comprises forming a reflective Dragone router.

26. The method of claim 25 where the reflective Dragone router is formed by cleaving a transmissive Dragone router in half.

27. The method of claim 24 further comprising coating the first facet mirror with a material so that it is partially transmissive.

28. The method of claim 24 further comprising coating the second facet mirror with a material so that it is partially transmissive.

29. The method of claim 24 further comprising coating the second facet mirror with an anti-reflection material at a single location associated with one of the waveguides defining the optical grating.

30. The method of claim 24 further comprising coating the first facet mirror with a material so that it is highly reflective.

31. The method of claim 24 further comprising coating the second facet mirror with a material so that it is highly reflective.

32. The method of claim 24 further comprising coating at least one of the facet mirrors with a wavelength selective material.

33. The laser of claim 24 further comprising forming the optical amplifiers so that they have a peaked gain profile.

34. A method of forming a tunable laser comprising:

forming a wavelength selective device in a semiconductive wafer, wherein the wavelength selective device includes a first and second free space region and a plurality of waveguides, each waveguide having a different length, the plurality of waveguides collectively defining an optical grating, and the optical grating is connected at each end to the free space regions;

forming a plurality of input waveguides in the semiconductive wafer which connect to the first free space region;

forming a plurality of output waveguides in the semiconductive wafer which connect to the second free space region;

forming at least two controllable optical amplifiers in at least two of the waveguides of the plurality of input waveguides and in at least two of the waveguides of the plurality of output waveguides by appropriately doping the waveguides in a suitable manner with semiconductors;

forming a device for selectively providing energy to the optical amplifiers;

cleaving the semiconductive wafer at two spaced locations to form a first and second facet mirror, where the first facet mirror is connected to the wavelength selective device by the input waveguides containing the optical amplifiers and the second facet mirror is connected to wavelength selective device by the output waveguides containing the optical amplifiers; and cleaving the semiconductive wafer through the optical grating to form a third and fourth facet mirror, where the first and third facet mirror define a first lasing cavity and the second and fourth facet mirror define a second lasing cavity, the first and second lasing cavity being of equal size.

* * * * *